US012601061B2

(12) United States Patent
Woo et al.

(10) Patent No.: US 12,601,061 B2
(45) Date of Patent: Apr. 14, 2026

(54) THIN FILM DEPOSITION APPARATUS HAVING MULTI-STAGE HEATERS AND THIN FILM DEPOSITION METHOD USING THE SAME

(71) Applicant: HANWHA PRECISION MACHINERY CO., LTD., Changwon-si (KR)

(72) Inventors: Ram Woo, Seoul (KR); Seung Jun Lee, Seoul (KR); Sang Yeop Kim, Seoul (KR); Jin Hwan Lee, Seoul (KR); Sang Bo Kim, Seoul (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 565 days.

(21) Appl. No.: 18/091,949

(22) Filed: Dec. 30, 2022

(65) Prior Publication Data

US 2023/0212750 A1  Jul. 6, 2023

(30) Foreign Application Priority Data

Dec. 31, 2021  (KR) ........................ 10-2021-0194457

(51) Int. Cl.
*C23C 16/46* (2006.01)
*C23C 16/458* (2006.01)

(52) U.S. Cl.
CPC .......... *C23C 16/46* (2013.01); *C23C 16/4586* (2013.01)

(58) Field of Classification Search
CPC .... C23C 16/4586; C23C 16/45; C23C 16/458
See application file for complete search history.

(56) References Cited

U.S. PATENT DOCUMENTS 7,033,126 B2  4/2006  Van Den Berg

FOREIGN PATENT DOCUMENTS

| KR | 10-2008-0082268 A | 9/2008 |
| KR | 10-2011-0072129 A | 6/2011 |
| KR | 10-1625478 B1 | 5/2016 |

OTHER PUBLICATIONS

Kim, KR2011/0072129 Eng translation, Jun. 2011.*
Office Action dated Sep. 9, 2024, issued by Korean Patent Office in Korean Patent Application No. 10-2021-0194457.
Communication issued on Jun. 12, 2024 by the Korean Intellectual Property Office for Korean Patent Application No. 10-2021-0194457.

* cited by examiner

*Primary Examiner* — Joseph A Miller, Jr.
(74) *Attorney, Agent, or Firm* — Sughrue Mion, PLLC

(57) ABSTRACT

A thin film deposition apparatus includes: a chamber configured to process a plurality of substrates; a plurality of heater members disposed to correspond to the substrates to heat the substrates; a plurality of lift pins configured to be elevated through the heater members and support lower surfaces of the substrates; a plurality of support plates on which lower ends of the lift pins are configured to be seated; a plurality of support columns coupled with and supporting the heater members; and a plurality of spray ports configured to supply a process gas to the substrates, wherein the support plates are mounted on a plurality of seats formed on at least one side of the chamber, and configured to be elevated together with the heater members when the heater members are elevated.

9 Claims, 13 Drawing Sheets

THIN FILM DEPOSITION APPARATUS HAVING MULTI-STAGE HEATERS AND THIN FILM DEPOSITION METHOD USING THE SAME

CROSS-REFERENCE TO RELATED APPLICATION

This application claims priority from Korean Patent Application No. 10-2021-0194457 filed on Dec. 31, 2021, in the Korean Intellectual Property Office, the disclosure of which is incorporated herein in its entirety by reference.

BACKGROUND

1. Field

The embodiments of the disclosure relate to thin film deposition technology, and more particularly, to a thin film deposition apparatus for depositing a thin film by supplying a reaction gas to a plurality of vertically stacked substrates and a thin film deposition method using the same.

2. Description of Related Art

In general, as examples of a thin film deposition method for depositing a thin film by supplying a reaction gas to a substrate, atomic layer deposition (ALD) and chemical vapor deposition (CVD) are known. The atomic layer deposition is a method of adsorbing and depositing a thin film on a substrate by alternately supplying and purging a reaction gas to the substrate, and the chemical vapor deposition is a method of depositing a thin film on the substrate by simultaneously spraying a reaction gas.

In an apparatus using such a thin film deposition method, a single substrate reactor directly heats the substrate and uniformly supplies the reaction gas to the substrate at a temperature lower than that of the substrate. Since such an apparatus processes only a single substrate, a high-quality thin film may be obtained, but there is a problem in that productivity is significantly reduced under the condition that deposition needs to be performed at a low deposition rate.

A thin film deposition apparatus having a vertical stacked multi-stage heater has recently been proposed. In the thin film deposition apparatus having such a multi-stage heater, the degree of exposure of a lift pin to an upper portion of the heater needs to be synchronously adjusted. To this end, the thin film deposition apparatus includes a separate driving member or requires a structure for holding a support plate having lift pins.

In the former case, there is a problem in that the structure becomes complicated to provide the separate driving member, the cost increases, and control for synchronizing the lift pin exposure timing with a process sequence is required. In the latter case, a structure in which the support plate is mounted/seated in a chamber causes interference when the heater and the support plate rotate simultaneously in a process position.

Therefore, it is necessary to provide a solution that properly exposes the lift pin at a load position or a process position even without a separate driving member for controlling the exposure of the lift pin in the thin film deposition apparatus having the multi-stage heater, and does not interfere with other structures even when the support plate rotates with the multi-stage heater at the process position.

SUMMARY

Example embodiments of the disclosure provide a thin film deposition apparatus in which a plurality of heater members and a plurality of support plates do not interfere with other structures even when the heater members and the support plates rotate together.

The example embodiments also provide a thin film deposition apparatus in which an exposure value of a lift pin is automatically adjusted according to a mutual relationship with a plurality of support plates while a plurality of heater members are elevated.

According to an example embodiment, there is provided a thin film deposition apparatus which may include: a chamber configured to process a plurality of substrates; a plurality of heater members disposed to correspond to the substrates to heat the substrates; a plurality of lift pins configured to be elevated through the heater members and support lower surfaces of the substrates; a plurality of support plates on which lower ends of the lift pins are configured to be seated; a plurality of support columns coupled with and supporting the heater members; and a plurality of spray ports configured to supply a process gas to the substrates, wherein the support plates are mounted on a plurality of seats formed on at least one side of the chamber, and configured to be elevated together with the heater members when the heater members are elevated.

A plurality of fingers protruding in a lateral direction may be formed on the support columns, and when the support columns are elevated together with the heater members, the fingers may lift lower surfaces of the support plates.

The seats may protrude from a sidewall of the chamber toward an inside of the chamber.

The seats may uniformly protrude from the sidewall of the chamber toward the inside of the chamber along a circumferential direction.

The seats may be formed with a plurality of steps so that the support plates are placed at right positions on the seats when the support plates are lowered together with the heater members.

At a load position where the lift pins are maximally exposed to upper sides of the heater members so that the substrates are loaded or unloaded, the support plates may maintain a state mounted on the seats even if the heater members are elevated.

At a contact position where the heater members are elevated together with the support columns and are moved by a specific distance, the fingers may start to be in contact with the lower surfaces of the support plates.

When the heater members may be moved by the specific distance, exposure values of the lift pins to the heater members may reach 0.

At a process position where the heater members are closest to the spray ports and the spray ports supply the process gas to the substrates, the lower ends of the lift pins and the supports may be spaced apart from each other, and the support plates and the seats may be farthest apart from each other.

The thin film deposition apparatus may further include a driver elevating, lowering or rotating the heater members, wherein a coupling groove engaging with one of the fingers is formed on the lower surface of each of the support plates, such that fluctuation between the heater members and the support plates is prevented even if the heater members are elevated or rotated.

According to an exemplary embodiment, there is provided a thin film deposition method performed by an apparatus including a chamber for processing a plurality of substrates, a plurality of heater members disposed to correspond to the substrates to heat the substrates, a plurality of support plates comprising a plurality of lift pins elevated through the heater members and supporting lower surfaces of the substrates, a plurality of support columns coupled with and supporting the heater members, and a plurality of spray ports supplying a process gas to the substrates. The thin film deposition method may include: mounting the support plates on a plurality of seats formed on at least one side of the chamber; integrally elevating the heater members and the support columns from a load position by a driver included in the apparatus; controlling a plurality of fingers formed on the support columns to contact lower surfaces of the support plates when the heater members are elevated by a specific distance; elevating the heater members and the support plates together to a process position in a state in which the fingers contact the lower surfaces of the support plates; and supplying the process gas to the substrates at the process position.

The thin film deposition method may further include, after the thin film deposition by supplying the process gas is completed: mounting the support plates on the seats again; and further lowering the heater members in a state in which the heater members are separated from the support plates and returning the heater members to a load position.

The thin film deposition method may further include unloading the substrates through a plurality of substrate entrances formed in the chamber at the load position.

The steps may be formed in the seats so that the support plates are placed at right positions when the support plates are mounted on the seats again.

Exposure values of the lift pins to the heater members may reach 0, before the fingers come into contact with the lower surfaces of the support plates.

The seats may protrude from a sidewall of the chamber toward an inside of the chamber.

A coupling groove engaged with one of the fingers may be formed on the lower surface of each of the support plates, such that fluctuation between the heater members and the support plates is prevented even if the heater members are elevated or rotated.

According to the thin film deposition apparatus according to the example embodiments, exposure values of the lift pins on the heater elements may be automatically adjusted to suit a current working stage without a separate driving device for adjusting exposure values of the lift pins formed on a plurality of support plates.

Further, according to the thin film deposition apparatus according to the example embodiments, the heater members and the support plates may not cause interference with other structures even when the heater members and the support plates rotate together at the process position, and the support plates may be separated from the heater members and stably seated on one side of the chamber when the heater members and the support plates are returned to an original load position.

BRIEF DESCRIPTION OF DRAWINGS

The above and other aspects and features of the disclosure will become more apparent by describing in detail exemplary embodiments thereof with reference to the attached drawings, in which.

4

Figure 1:
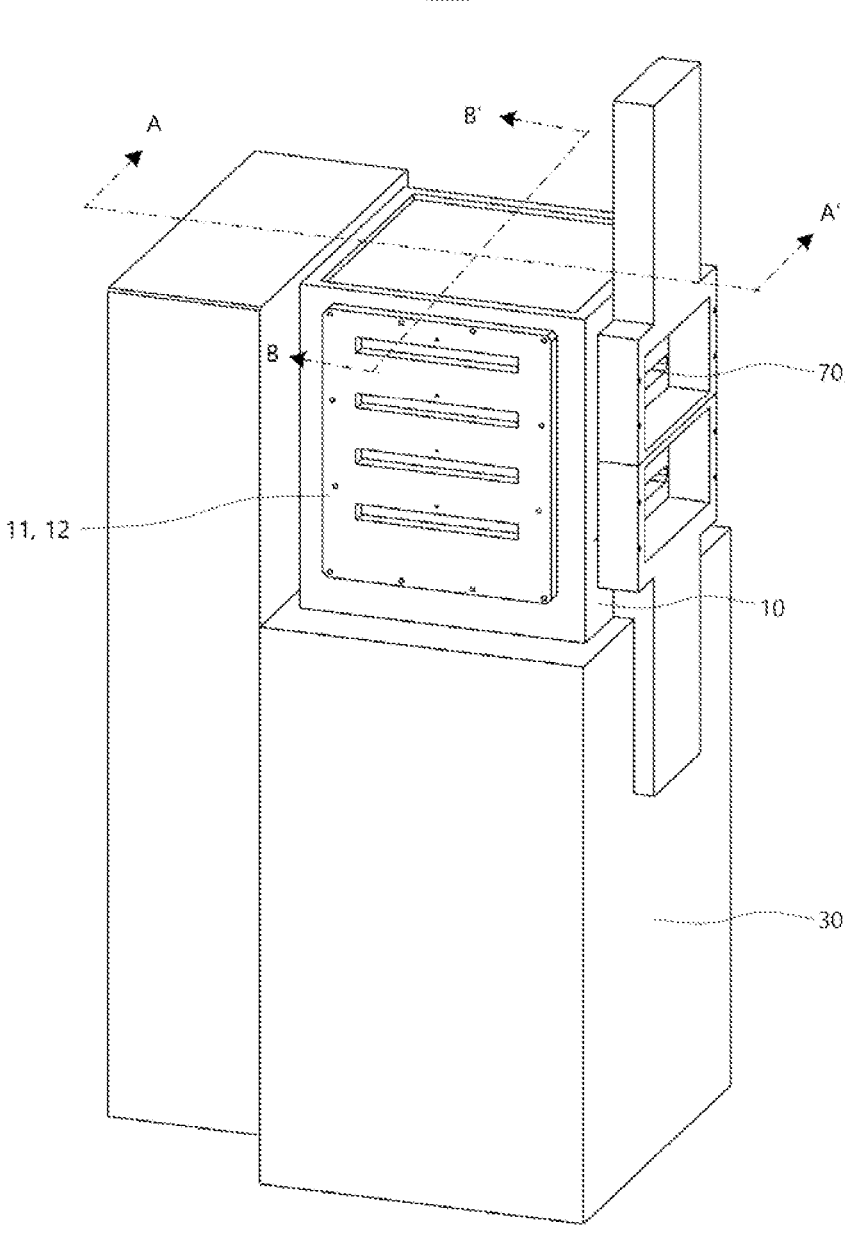
FIG. 1 is a perspective view illustrating a thin film deposition apparatus according to an example embodiment.
Figure 3A:
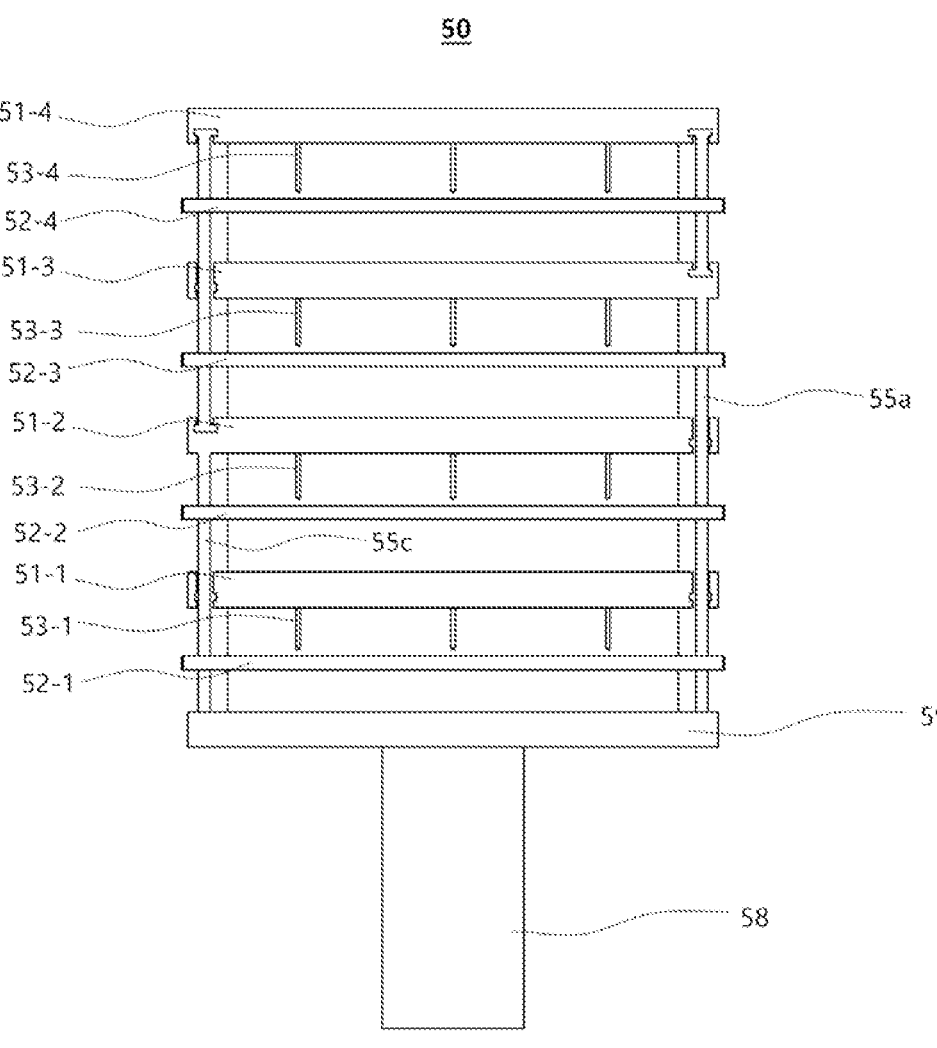
Figure 3B:
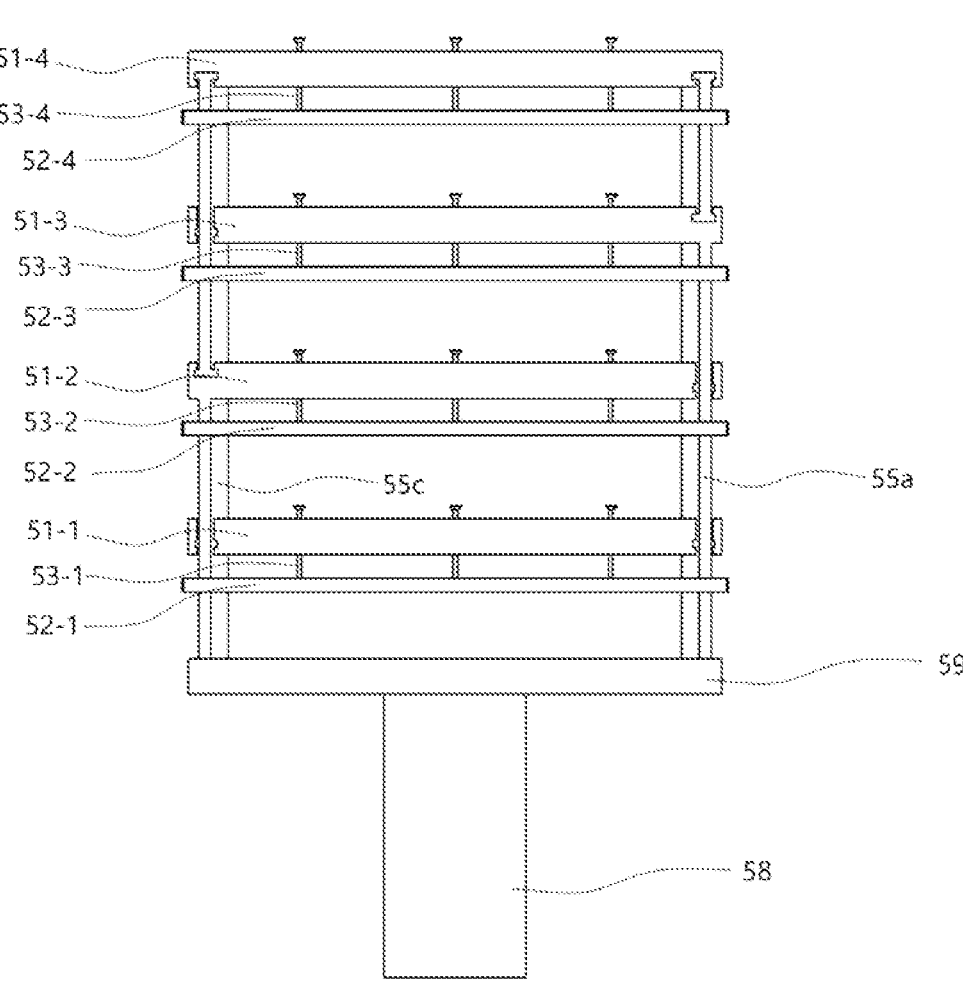
Figure 4:
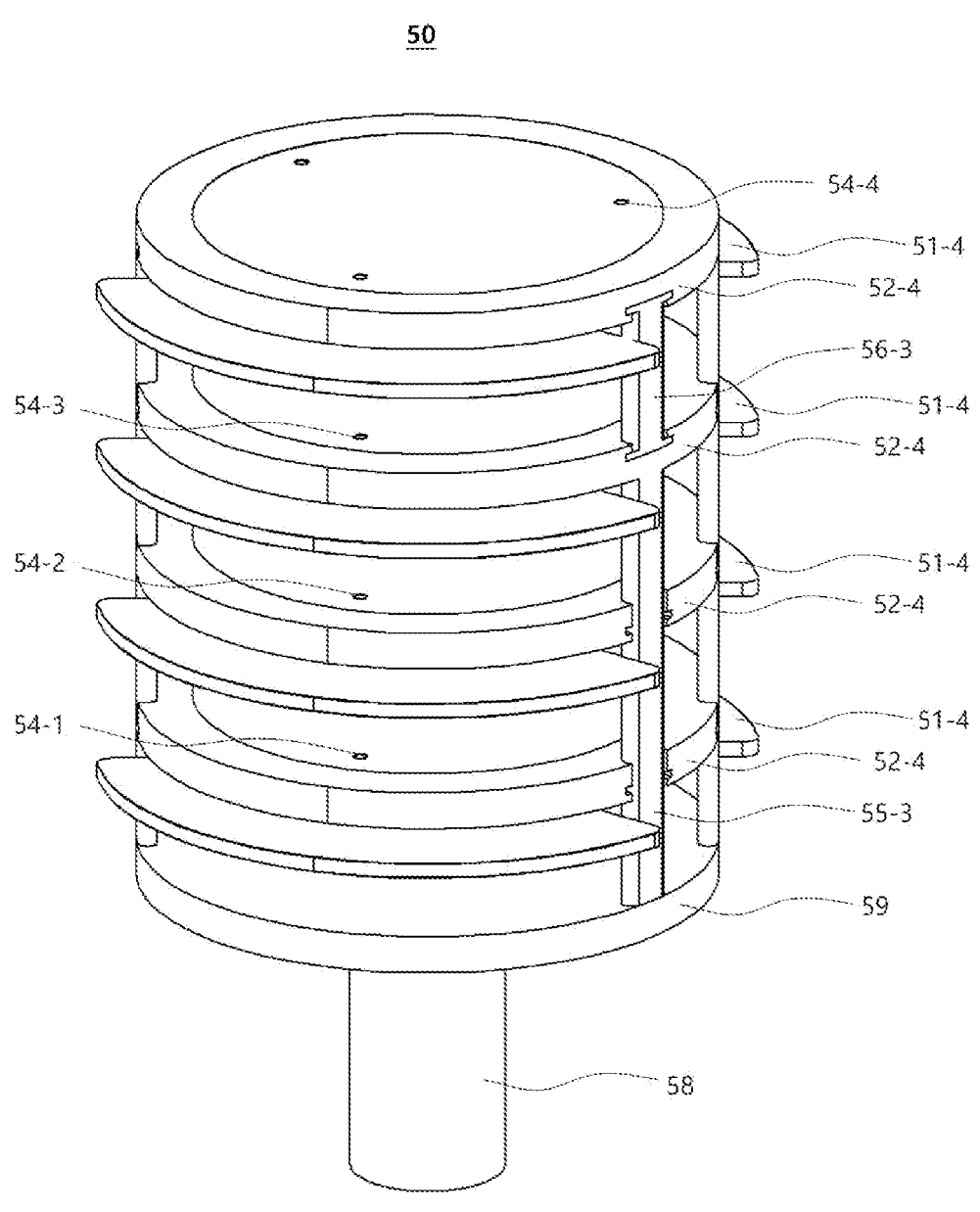
Figure 5:
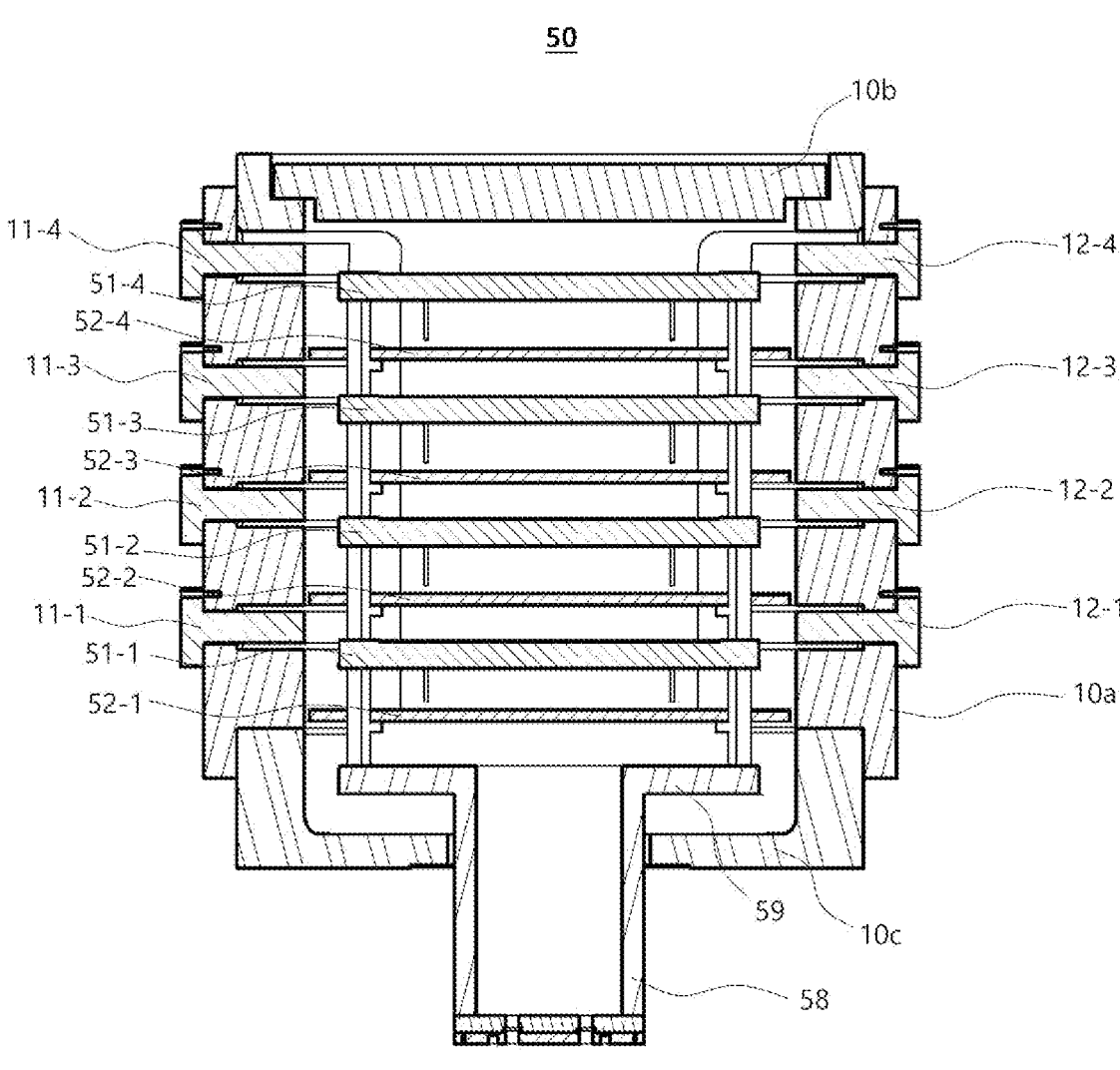
Figure 6:
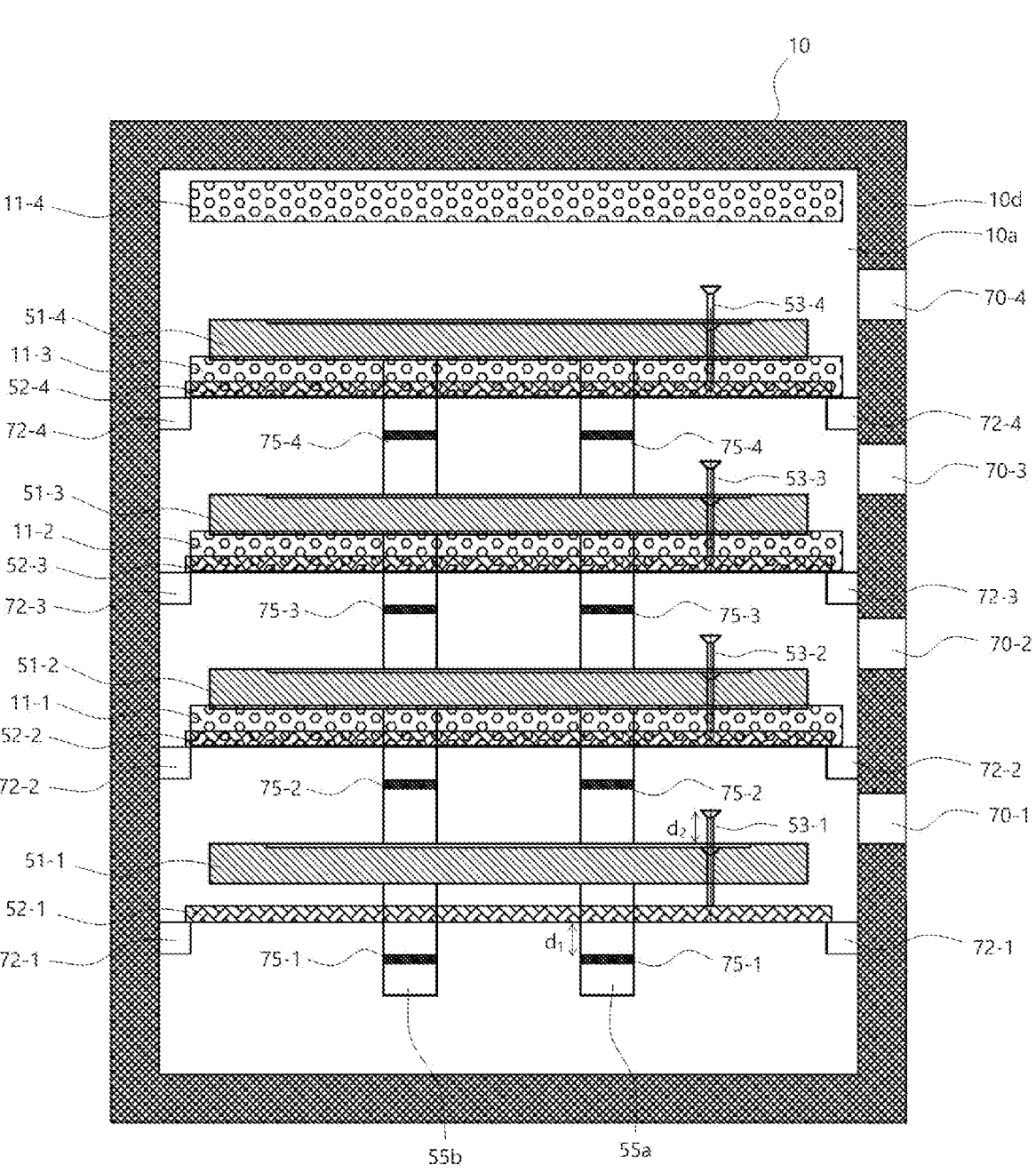
Figure 7:
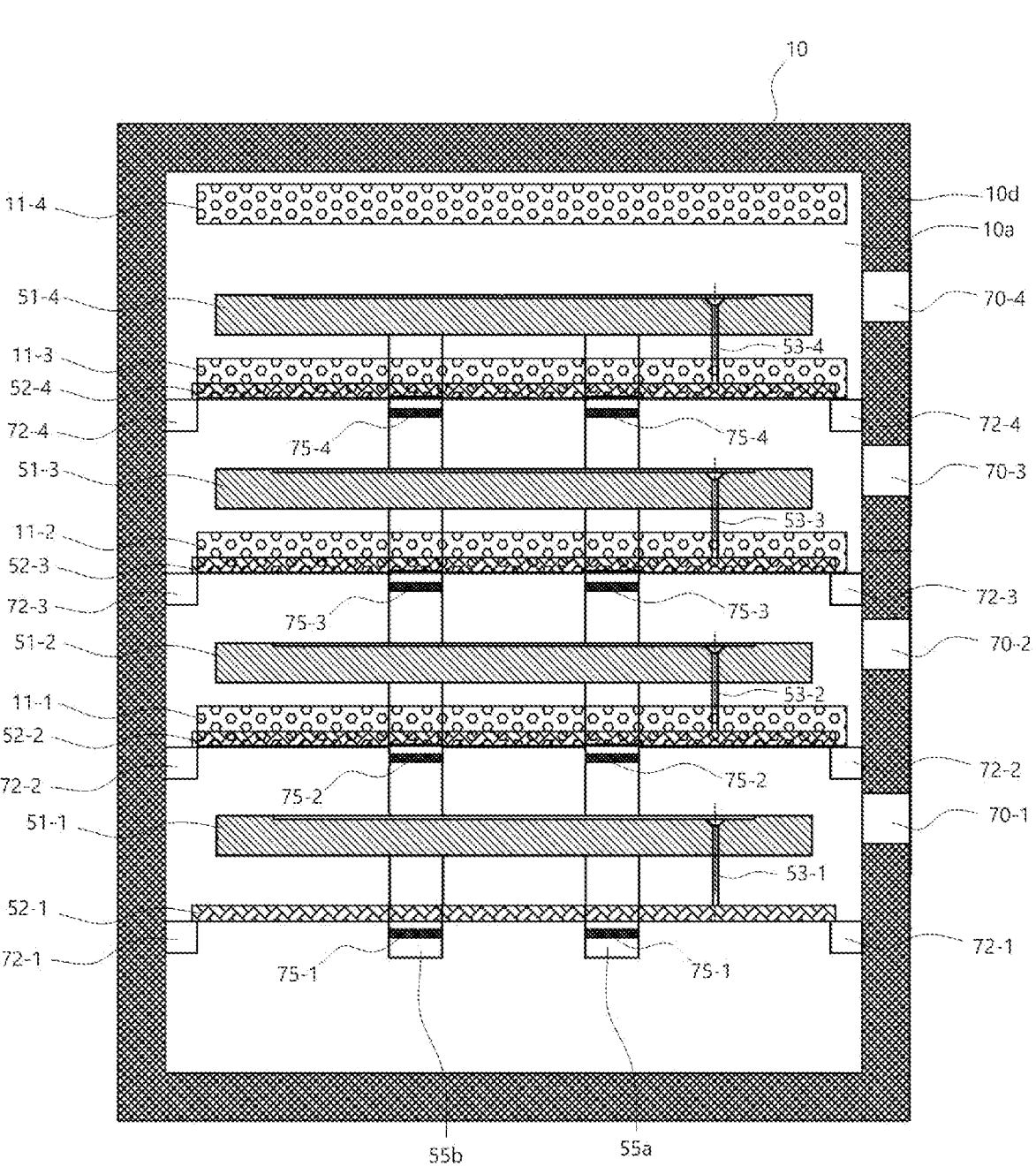
Figure 8:
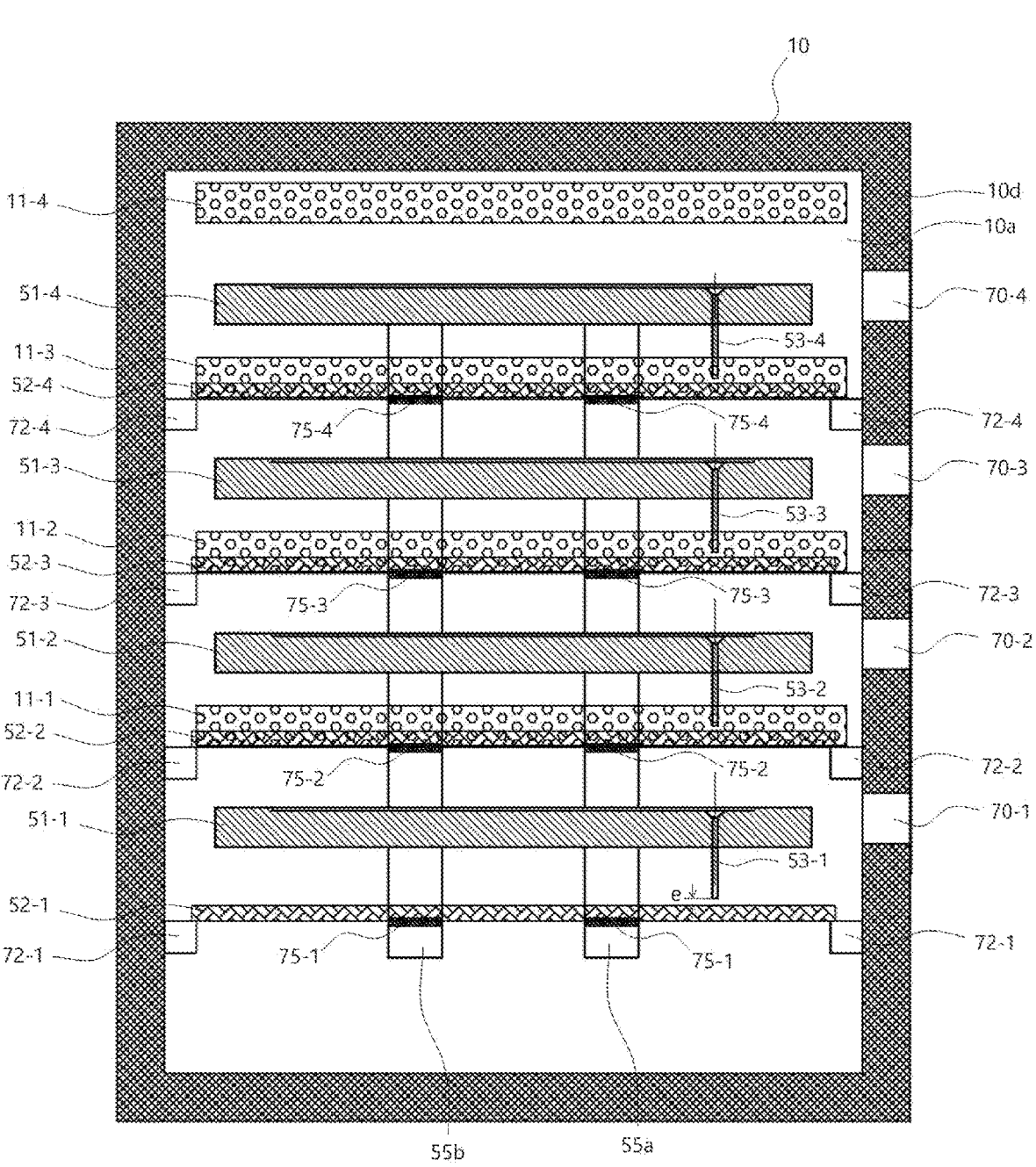
Figure 9:
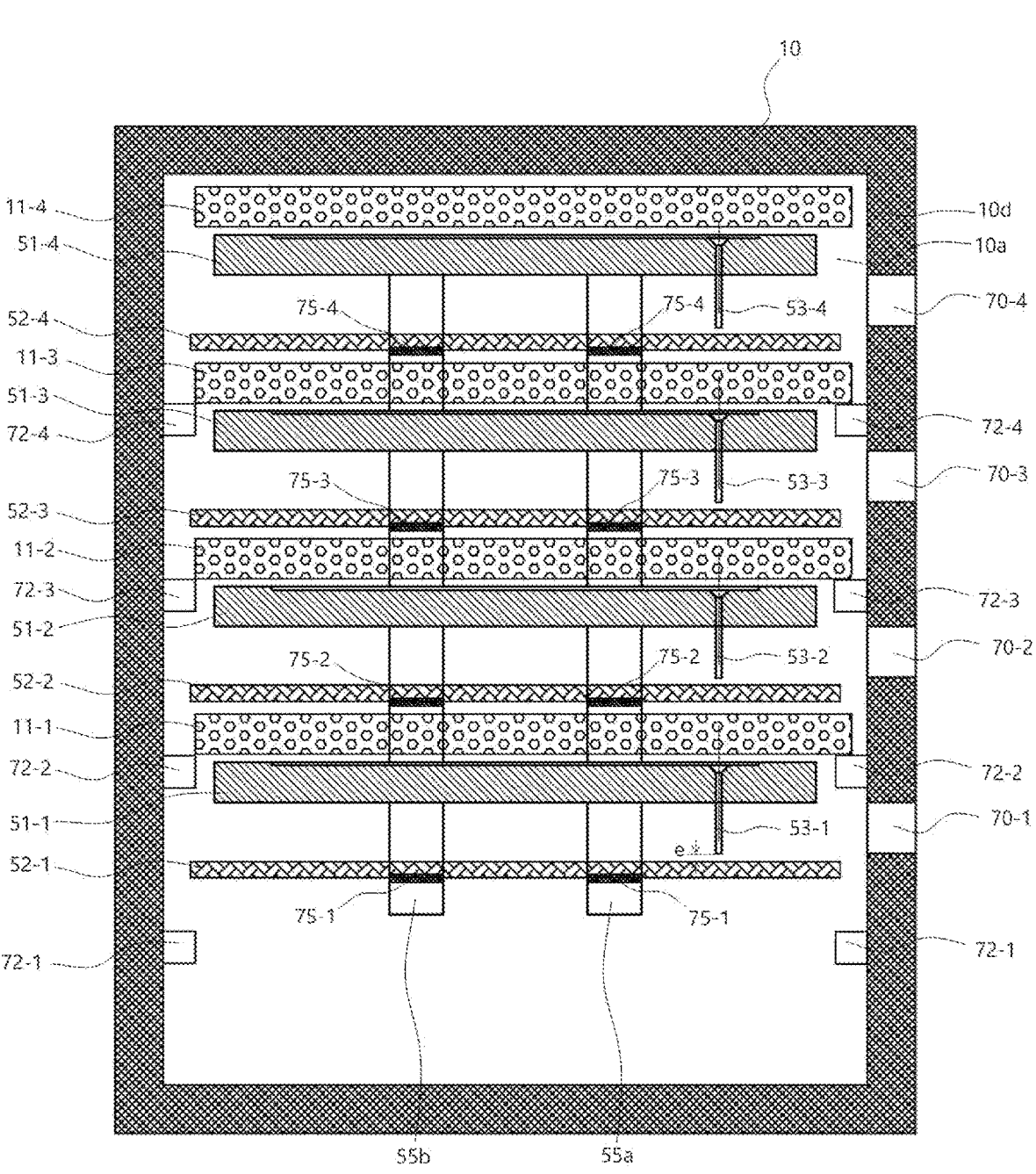
Figure 10:
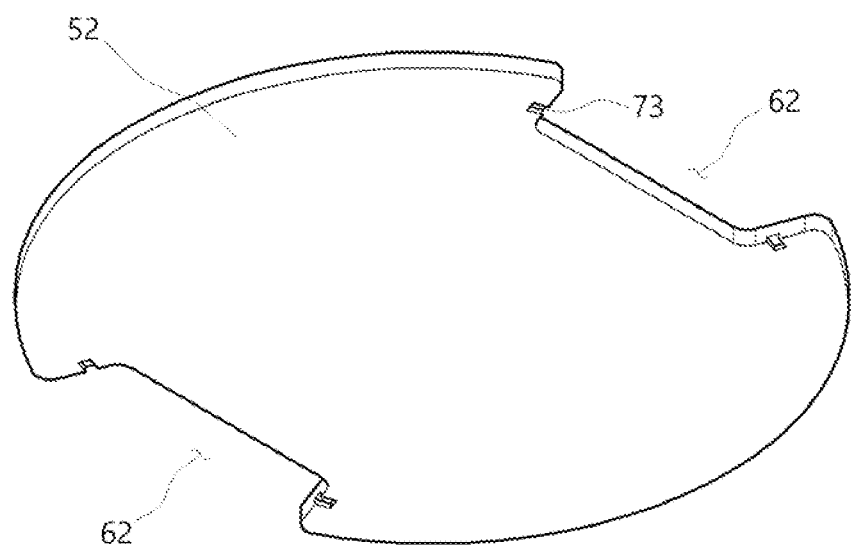
Figure 11:
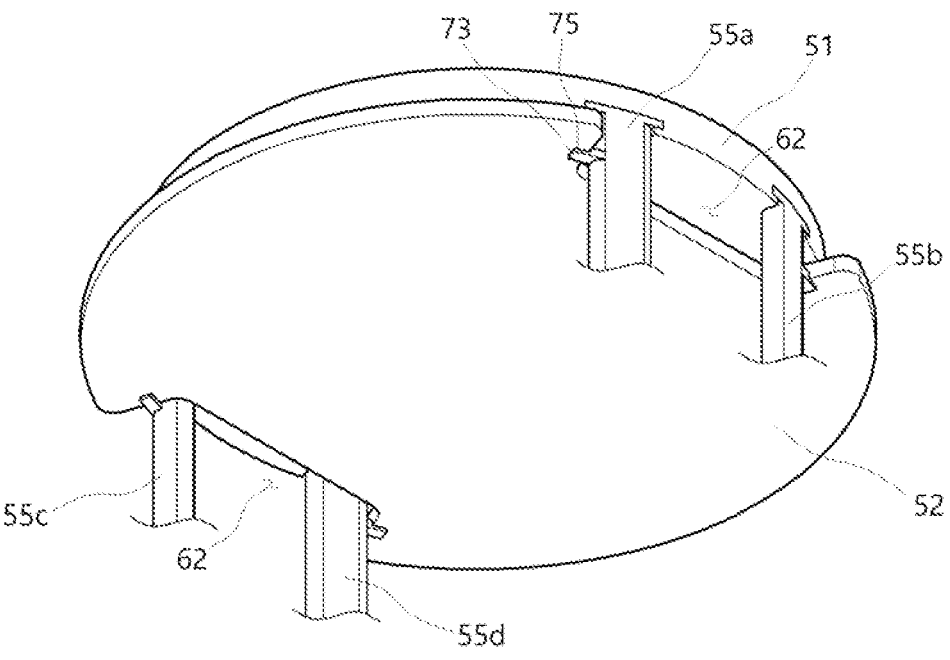
Figure 12:
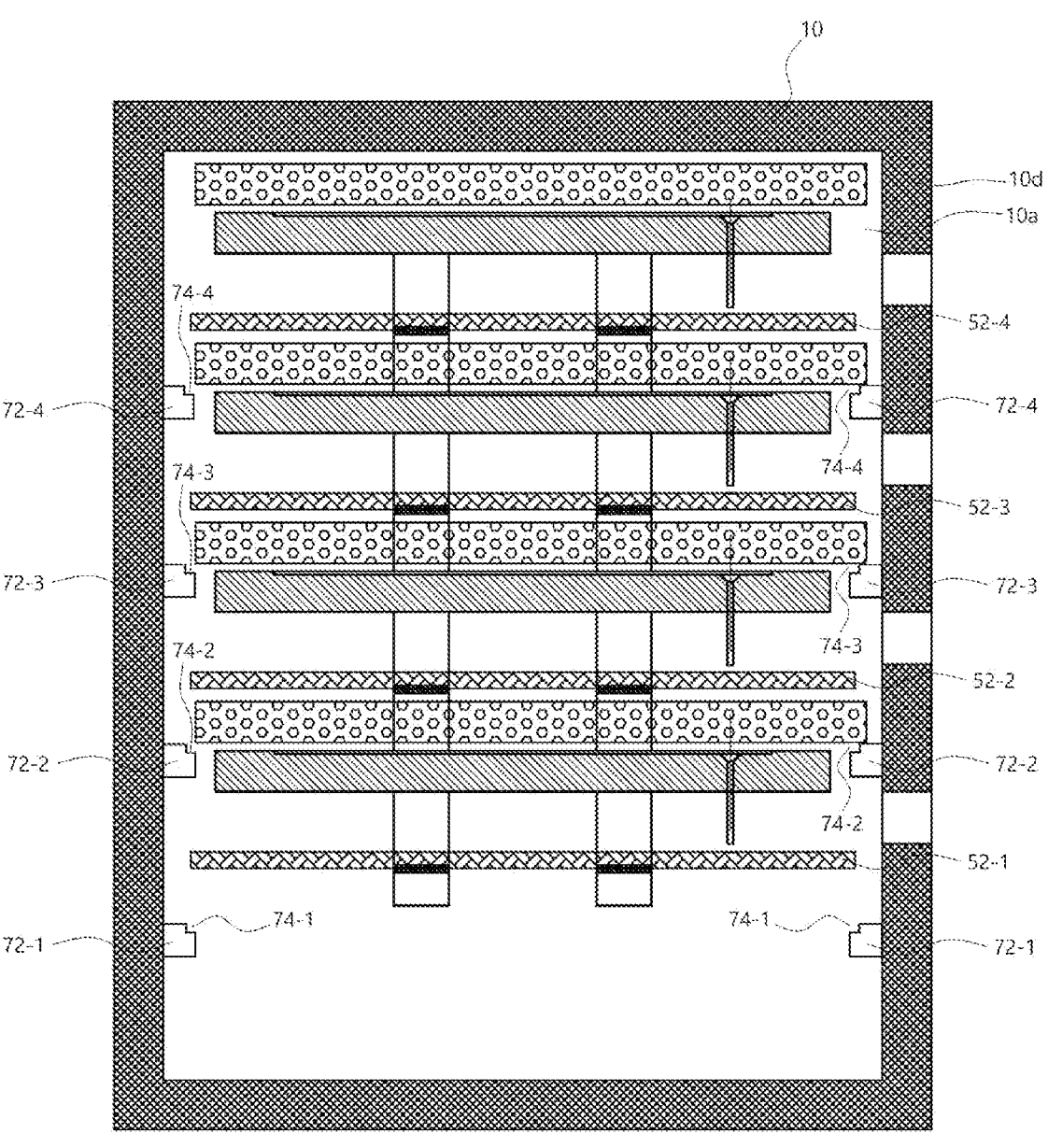

FIG. 3A is a front view illustrating a multi-stage heater assembly mounted on a base at a process position;

FIG. 3B is a front view illustrating the multi-stage heater assembly mounted on the base at a load position;

FIG. 4 is a perspective view illustrating the multi-stage heater assembly of FIG. 3A;

FIG. 5 is a cross-sectional perspective view of the thin film deposition apparatus of FIG. 1 taken in a direction B-B';

FIG. 6 is a view illustrating relative positions among a plurality of heat members, lift pins, and a plurality of support plates at a load/unload position;

FIG. 7 is a view illustrating relative positions among a plurality of heat members, lift pins, and a plurality of support plates at a pin release position;

FIG. 8 is a view illustrating relative positions among a plurality of heat members, lift pins, and a plurality of support plates at a contact position;

FIG. 9 is a view illustrating relative positions among a plurality of heat members, lift pins, and a plurality of support plates at a process position;

FIG. 10 is a perspective view of a support plate according to an example embodiment viewed from below;

FIG. 11 is a perspective view of a state in which a finger is coupled to a coupling groove formed in the support plate viewed from below; and FIG. 12 is a view illustrating an example in which a stepped portion is additionally formed in a seat by modifying FIG. 9.

DETAILED DESCRIPTION OF EMBODIMENTS

Advantages and features of the disclosure and methods to achieve them will become apparent from the descriptions of example embodiments herein below with reference to the accompanying drawings. However, the disclosure is not limited to example embodiments disclosed herein but may be implemented in various ways. The example embodiments are provided for making the disclosure thorough and for fully conveying the scope of the disclosure to those skilled in the art. It is to be noted that the scope of the disclosure is defined only by the claims. Like reference numerals denote like elements throughout the descriptions.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Terms used herein are for illustrating the embodiments rather than limiting the disclosure. As used herein, the singular forms are intended to include plural forms as well, unless the context clearly indicates otherwise. Throughout this specification, the word "comprise" and variations such as "comprises" or "comprising," will be understood to imply the inclusion of stated elements but not the exclusion of any other elements.

Hereinafter, example embodiments will be described in detail with reference to the accompanying drawings.

FIG. 1 is a perspective view illustrating a thin film deposition apparatus 100 according to an example embodiment.

The thin film deposition apparatus 100 may include a chamber 10 for processing a plurality of substrates, a substrate entrance 70 for loading or unloading the substrates by a substrate transfer means such as a robot arm (not shown), a spray port 11 formed on a sidewall of the chamber 10 to supply a process gas to each of the substrates, and an exhaust port 12 for discharging residuals of the process gas. In addition, the thin film deposition apparatus 100 may include a lower block 30 including a driver 20 (shown in FIGS. 2A and 1B) for elevating or rotating components in the chamber 10.

Figure 2A:
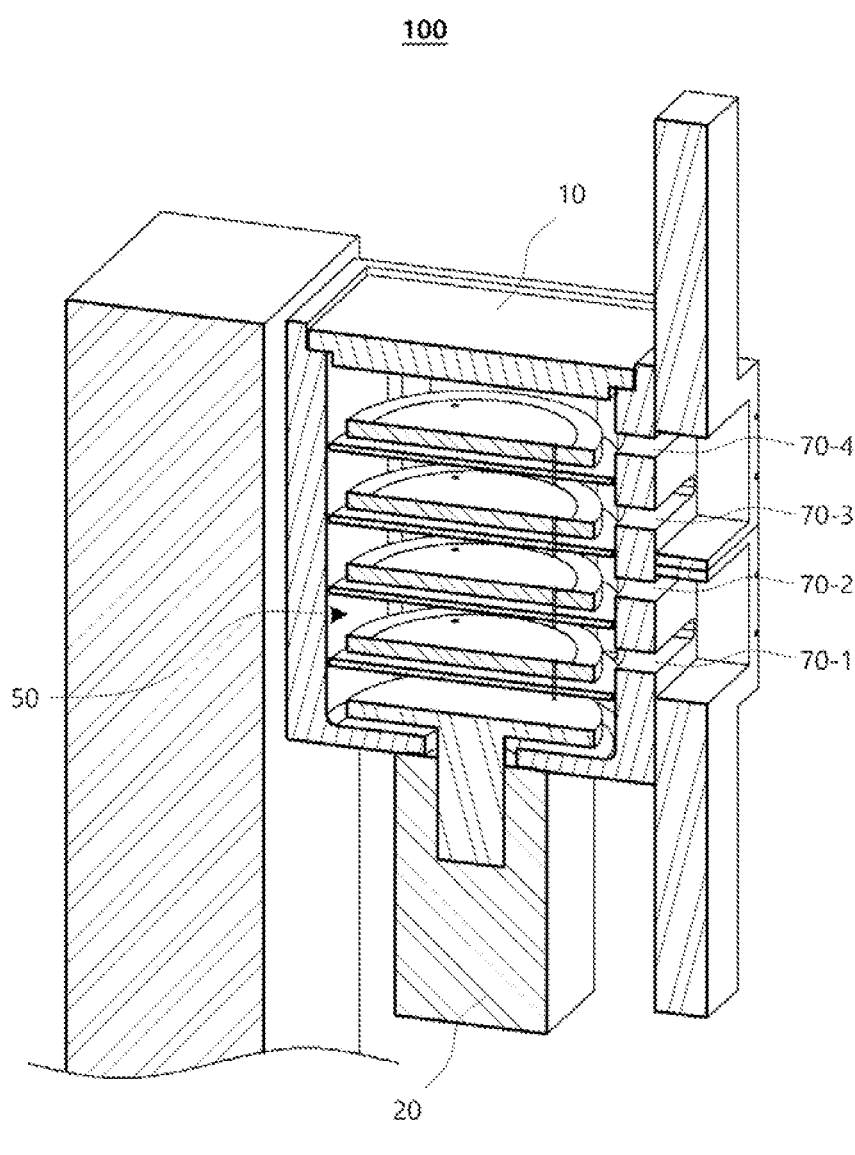
FIG. 2A is a cross-sectional perspective view of the thin film deposition apparatus of FIG. 1 taken in a direction A-A'.
Figure 2B:
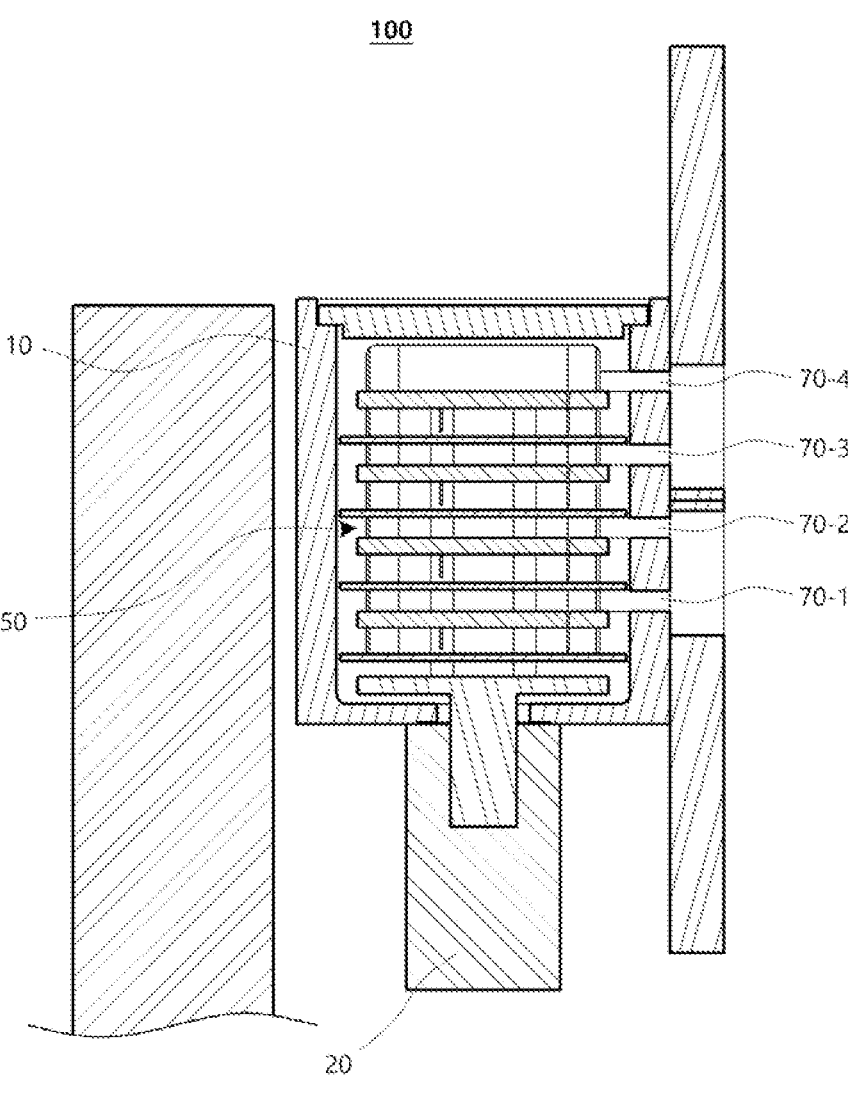
FIG. 2B is a longitudinal cross-sectional view of the thin film deposition apparatus of FIG. 1 taken in a direction A-A'.

FIG. 2A is a cross-sectional perspective view of the thin film deposition apparatus 100 of FIG. 1 taken along a line A-A' and FIG. 2B is a longitudinal cross-sectional view of the thin film deposition apparatus 100 of FIG. 1 taken along a line A-A'. Referring to FIGS. 2A and 2B, a multi-stage heater assembly 50 in which heater members and support plates are installed in multiple layers is accommodated inside the chamber 10. This multi-stage heater assembly 50 may be configured to be able to be elevated and rotated by the driver 20 disposed at a lower side thereof. The driver 20 may be configured such that, for example, a rotatable motor is disposed on an elevatable linear actuator to provide both rotating and elevating motions. The rotation generally refers to a rotational motion within 360 degrees while changing a direction of rotation, and the elevation refers to a linear motion between a load position for loading or unloading a substrate and a process position for deposition on the substrate.

FIG. 3A is a front view illustrating a multi-stage heater assembly 50 mounted on a base 59 at a process position, and FIG. 3B is a front view illustrating the multi-stage heater assembly 50 mounted on the base 59 at a load position.

The multi-stage heater assembly 50 may include a plurality of heater members 51-1, 51-2, 51-3, and 51-4 disposed to correspond to a lower portion of each of the substrates (not illustrated) to heat the substrates, a plurality of sets of lift pins 53-1, 53-2, 53-3, and 53-4 supporting lower surfaces of the substrates while elevating through each of the heater members 51-1, 51-2, 51-3, and 51-4, and a plurality of support plates 52-1, 52-2, 52-3, and 52-4 on which lower ends of the sets of the lift pins 53-1, 53-2, 53-3, and 53-4 may be seated. Each set of the lift pins 53-1, 53-2, 53-3, and 53-4 may include at least one lift pin. As illustrated in FIG. 4 to be described later, the lift pins 53-1, 53-2, 53-3, and 53-4 may be inserted into a plurality of sets of through-holes 54-1, 54-2, 54-3, and 54-4 penetrating through the heater members 51-1, 51-2, 51-3, and 51-4 in a thickness direction and exposed to upper sides of the heater members 51-1, 51-2, 51-3, and 51-4. Each set of the through-holes 54-1, 54-2, 54-3, and 54-4 may include at least one through-hole for a corresponding at least one lift pin.

When the substrates are loaded/unloaded at the load position, the lift pins 53-1, 53-2, 53-3, and 53-4 may be maximally exposed upward from the heater members 51-1, 51-2, 51-3, and 51-4 as illustrated in FIG. 3B. On the other hand, when the substrates are being deposited at the process position, the lift pins 53-1, 53-2, 53-3, and 53-4 are not exposed from the heater members 51-1, 51-2, 51-3, and 51-4. As a result, the substrates may be seated on the heater members 51-1, 51-2, 51-3, and 51-4. As described above, the lift pins 53-1, 53-2, 53-3, and 53-4 may be inserted into the through-holes 54-1, 54-2, 54-3, and 54-4 of the heater members and may be elevated therein, while lower ends of the lift pins 53-1, 53-2, 53-3, and 53-4 may be seated on upper surfaces of the support plates 52-1, 52-2, 52-3, and 52-4 (acting as a stopper) or may be slightly spaced apart from the upper surfaces depending on a working sequence in the chamber 10. In addition, the lift pins 53-1, 53-2, 53-3, and 53-4 may be synchronously elevated within the chamber 10 regardless of the layers to which the lift pins 53-1, 53-2, 53-3, and 53-4 belong.

The heater members 51-1, 51-2, 51-3, and 51-4 may be integrally coupled and supported by a plurality of support columns 55 and 56. The support columns 55 and 56 may be seated on the base 59 disposed at a lower side thereof, and may be formed in four equal to the number of layers of the heater member, but are not limited thereto. As an example, the support columns 55 and 56 may include a plurality of base columns 55 (55a, 55b, 55c, and 55d) and a plurality of connection columns 56 (56-1, 56-2, and 56-3). The heater members 51-1, 51-2, 51-3, and 51-4 may be integrally formed with corresponding base columns 55 (55a, 55b, 55c, and 55d), respectively, and may be connected to and supported by corresponding connection columns 56 (56-1, 56-2, and 56-3), respectively. Alternatively or additionally, the heater members 51-1, 51-2, 51-3, and 51-4 may be provided to be separable from and coupled to the base columns 55 and the connection columns 56. Accordingly, when any one of the heater members 51-1, 51-2, 51-3, and 51-4 is damaged or broken, a maintenance cost of the apparatus may be improved because only the damaged or broken heater member 51 may be replaced instead of all of the heater members 51. Herein, the base columns 55 may also be referred to as the support columns 55.

In this case, the driver 20 may elevate and lower the base 59 in the chamber 10 by an elevating/lowering module included therein, and at the same time, may rotate the base 59 in the chamber 10 by a rotation module included therein. Therefore, the multi-stage heater assembly 50 coupled by the support columns 55 and 56 may be integrally elevated, lowered or rotated together with the base 59. However, the support plates 52-1, 52-2, 52-3, and 52-4 may require a structure that relatively elevates (exposes) the lift pins 53-1, 53-2, 53-3, and 53-4 with respect to the heater members 51-1, 51-2, 51-3, and 51-4. According to an example embodiment, exposure control of the lift pins 53-1, 53-2, 53-3, and 53-4 may be performed by itself without a separate driving device. A more detailed description thereof will be described later with reference to FIGS. 6 to 9.

For the above-described functions of elevation, lowering and rotating, the driver 20 may also include one or more processors, such as a microprocessor, executing various computer instructions to controls the elevating/lowering module and the rotation module which may be formed of hardware and/or software. The driver 20 may also include one or more memories storing the computer instructions to be executed by the processors.

FIG. 4 is a perspective view illustrating the multi-stage heater assembly 50 of FIG. 3A. The support plates 52-1, 52-2, 52-3, and 52-4 are disposed between the heater members 51-1, 51-2, 51-3, and 51-4, and the lift pins 53-1, 53-2, 53-3, and 53-4 are formed on the support plates 52-1, 52-2, 52-3, and 52-4.

Meanwhile, it is preferable but not necessary that the support columns 55 and 56 may be disposed to have different circumferential intervals, that is, to have a short circumferential distance space and a long circumferential distance space, along circumferential directions of the heater members 51-1, 51-2, 51-3, and 51-4 and the support plates 52-1, 52-2, 52-3, and 52-4. The reason for disposing the support columns 55 and 56 in this manner is to secure a sufficient space so that the substrate may be loaded/unloaded on the heater members 51-1, 51-2, 51-3, and 51-4. Therefore, the substrates may be loaded and unloaded through the long circumferential distance space between the support columns 55 and 56. Therefore, in FIG. 2A, substrate entrances 70-1, 70-2, 70-3, and 70-4 may be all aligned with the long circumferential distance space between the support columns 55 and 56.

FIG. 5 is a cross-sectional perspective view of the thin film deposition apparatus 100 of FIG. 1 taken along a line B-B'. The chamber 10 may include a sidewall 10a, an upper cover 10b, and a lower wall 10c. Here, the upper cover 10b may be provided to open the inside of the chamber 10 for management, and the lower wall 10c may include an opening to allow the shaft 58 extending from the base 59 to penetrate therethrough.

A plurality of spray ports 11-1, 11-2, 11-3, and 11-4 and a plurality of exhaust ports 12-1, 12-2, 12-3, and 12-4 corresponding to the substrates may be installed on the sidewall 10a of the chamber 10. The spray ports 11-1, 11-2, 11-3, and 11-4 may supply a process gas to the substrates, and the exhaust ports 12-1, 12-2, 12-3, and 12-4 may have a function of discharging a residual gas remaining after the process gas makes deposition on the substrates.

When the heater members 51-1, 51-2, 51-3, and 51-4 are further elevated from the positions illustrated in FIG. 5 to be disposed for the deposition process, the spray ports 11-1, 11-2, 11-3, and 11-4 may be closest to upper surfaces of the substrates or heater members 51-1, 51-2, 51-3, and 51-4. That is, a deposition space for processing each substrate may be positioned on the same line as each spray port and exhaust port within an error range.

In this case, four deposition spaces corresponding to the four spray ports 11-1, 11-2, 11-3, and 11-4 may be formed. For example, a fourth spray port 11-4 may be responsible for or correspond to a deposition space between the upper cover 10b and the heater member 51-4, a third spray port 11-3 may be responsible for or correspond to a deposition space between the heat shield plate 52-4 and the heater member 51-3, a second spray port 11-2 may be responsible for or correspond to a deposition space between the heat shield plate 52-3 and the heater member 51-2, and a first spray port 11-1 may be responsible for or correspond to a deposition space between the heat shield plate 52-2 and the heater member 51-1.

In addition, when the deposition space is formed through the elevation of the heater members 51-1, 51-2, 51-3, and 51-4, heights and sizes of the deposition spaces may also be controlled or changed according to the elevation positions of the heater members 51-1, 51-2, 51-3, and 51-4. Therefore, it may also be possible to finely adjust the elevation heights of the heater members 51-1, 51-2, 51-3, and 51-4 by the elevating/lowering module of the driver 20 depending on the deposition conditions such as the size of the substrate, the type of deposition gas, and the deposition rate.

Meanwhile, although not illustrated, a plurality of temperature sensors mounted to correspond to the heater members 51-1, 51-2, 51-3, and 51-4 may be provided inside the chamber 10. Accordingly, variable control may be possible so that each of the heater members 51-1, 51-2, 51-3, and 51-4 may be controlled to an individual temperature based on temperatures detected by the temperature sensors. That is, when heat shielding is not sufficiently achieved even by the heat shield plates 52-1, 52-2, 52-3, and 52-4, the substrate may be deposited at a more accurate temperature through variable temperature controls. In addition, as the temperature of each of the heater members 51-1, 51-2, 51-3, and 51-4 may be individually controlled, temperatures of the deposition spaces may be individually controlled. To this end, separate heat sources and power cables may need to be provided for each of the heater members 51-1, 51-2, 51-3, and 51-4. This will be described later with reference to FIG. 9A.

Hereinafter, functions and operations of components in the chamber 10 of the thin film deposition apparatus 100 will be described in more detail. FIGS. 6 to 9 are views illustrating relative positions of the heat members 51-1, 51-2, 51-3, and 51-4 and the support plates 52-1, 52-2, 52-3, and 52-4 at a load/unload position, a pin release position, a contact position, and a process position, respectively.

The chamber 10 accommodates the heater members 51-1, 51-2, 51-3, and 51-4 disposed to correspond to the lower surfaces of the substrates to heat the substrates, and the support plates 52-1, 52-2, 52-3, and 52-4 disposed adjacent to the heater members 51-1, 51-2, 51-3, and 51-4 are, respectively. In addition, the lift pins 53-1, 53-2, 53-3, and 53-4 are fixedly disposed on the support plates. the heater members 51-1, 51-2, 51-3, and 51-4 are integrally coupled while being supported by the support columns 55a, 55b, 55c, and 55d.

In addition, a plurality of spray ports 11-1, 11-2, 11-3, and 11-4 for supplying a process gas to the substrates when the substrates are at the process position are formed on one sidewall 10a of the chamber 10.

The support plates 52-1, 52-2, 52-3, and 52-4 may be mounted on a plurality of seats 72-1, 72-2, 72-3, and 72-4 formed on at least one side of the chamber 10, and may be elevated together with the heater members 51-1, 51-2, 51-3, and 51-4 when the support columns 55a, 55b, 55c, and 55d are elevated by the driver 20.

The seats 72-1, 72-2, 72-3, and 72-4 may protrude from the sidewall 10a of the chamber 10 toward an inside of the chamber 10. The seats may have a protrusion shape that locally protrudes toward the inside of the chamber 10, but is not limited thereto, and may also have a rim shape that uniformly protrudes toward the inside of the chamber 10 along a circumferential direction.

Meanwhile, fingers 75-1, 75-2, 75-3, and 75-4 protruding to a lateral direction are formed on the support columns 55a, 55b, 55c, and 55d, respectively, such that when the support columns 55a, 55b, 55c, and 55d are elevated together with the heater members 51-1, 51-2, 51-3, and 51-4, the fingers 75-1, 75-2, 75-3, and 75-4 may lift lower surfaces of the support plates 52-1, 52-2, 52-3, and 52-4.

Referring to FIG. 6, the lift pins 53-1, 53-2, 53-3, and 53-4 are maximally exposed to upper sides of the heater members 51-1, 51-2, 51-3, and 51-4 at the load position so that the substrates may be loaded or unloaded through the substrate entrances 70-1, 70-2, 70-3, and 70-4. Accordingly, since there are spaces between the substrates on the lift pins 53-1, 53-2, 53-3, and 53-4 and the heater member 51-1, 51-2, 51-3, and 51-4, the substrates may be drawn out of the chamber 10, or external substrates may be drawn into the chamber 10 and placed on the lift pins 53-1, 53-2, 53-3, and 53-4. In addition, at the load position, the support plates 52-1, 52-2, 52-3, and 52-4 are in a state of being mounted on the seats 72-1, 72-2, 72-3, and 72-4 formed on at least one side of the chamber 10, and maintain the state of being mounted on the seats even when the heater members 51-1, 51-2, 51-3, and 51-4 are elevated to some extent.

Thereafter, when the heater members 51-1, 51-2, 51-3, and 51-4 may be elevated together with the support columns 55a, 55b, 55c, and 55d and move by a specific distance ($d_2$ in FIG. 6), the heater members 51-1, 51-2, 51-3, and 51-4 reach a pin release position as illustrated in FIG. 7. At the pin release position, the fingers 75-1, 75-2, 75-3, 75-4 formed on the support columns 55a, 55b, 55c, and 55d may be just before in contact with the lower surfaces of the support plates 52-1, 52-2, 52-3, and 52-4, and exposure values of the lift pins 53-1, 53-2, 53-3, and 53-4 reach zero (0). As described above, the exposure value becomes 0 at the pin release position, the fingers have yet to come into contact with the lower surface of the support plate. Therefore, for such a configuration, a distance $d_1$ between the finger 75-1 and the lower surface of the support plate 52-1 needs to be designed to be slightly greater than the exposure value $d_2$ of the lift pin 53-1 on the heater member 51-1 at the load position illustrated in FIG. 6.

When the heater members 51-1, 51-2, 51-3, and 51-4 are further elevated after the pin release position, heads of the lift pins 53-1, 53-2, 53-3, and 53-4 are caught on upper ends of the through-holes 54-1, 54-2, 54-3, and 54-4 (in FIG. 4) of the heater members 51-1, 51-2, 51-3, and 51-4. Therefore, lower ends of the lift pins 53-1, 53-2, 53-3, and 53-4 start to be separated from the support plates 52-1, 52-2, 52-3, and 52-4. At the same time, the fingers 75-1, 75-2, 75-3, and 75-4 formed on the support columns 55 may be in contact with lower ends of the support plates 52-1, 52-2, 52-3, and 52-4.

As described above, components within the chamber 10 at a contact position in which the fingers 75-1, 75-2, 75-3, and 75-4 are in contact with the lower ends of the support plates 52-1, 52-2, 52-3, and 52-4 are illustrated in FIG. 8. In FIG. 8, the lower ends of the lift pins 53-1, 53-2, 53-3, and 53-4 are spaced apart from the support plates 52-1, 52-2, 52-3, and 52-4 by a predetermined distance e.

After the contact position, the support plates 52-1, 52-2, 52-3, and 52-4 placed on the fingers 75-1, 75-2, 75-3, and 75-4 are also elevated together, as the heater members 51-1, 51-2, 51-3, and 51-4 are elevated. Through such an elevation, when the heater members 51-1, 51-2, 51-3, and 51-4 reach the process position as illustrated in FIG. 9, the heater members 51-1, 51-2, 51-3, and 51-4 may come closest to the spray ports 11-1, 11-2, 11-3, and 11-4. At the process position, the spray ports 11-1, 11-2, 11-3, and 11-4 may perform a deposition process of supplying the process gas to the substrates disposed on the heater members 51-1, 51-2, 51-3, and 51-4. In this case, the support plates 52-1, 52-2, 52-3, and 52-4 and the seats 72-1, 72-2, 72-3, and 72-4 may be farthest apart from each other. As described above, from the contact position to the process position, relative distances between the heater members 51-1, 51-2, 51-3 and 51-4 and the support plates 52-1, 52-2, 52-3 and 52-4 do not change even if the heater members 51-1, 51-2, 51-3, and 51-4 and the support plates 52-1, 52-2, 52-3, and 52-4 are elevated together. Therefore, the distance e between the lower ends of the lift pins 53-1, 53-2, 53-3, and 53-4 and the support plates 52-1, 52-2, 52-3, and 52-4 may not be changed, and remain the same as in the contact position.

After the thin film deposition by supplying the process gas is completed, the support columns 55a, 55b, 55c, and 55d may be lowered by the driver 20. Accordingly, the heater members 51-1, 51-2, 51-3, and 51-4 and the support plates 52-1, 52-2, 52-3, and 52-4 may also be lowered together.

When the heater members 51-1, 51-2, 51-3, and 51-4 reach the contact position as illustrated in FIG. 8 through the above-described lowering, the support plates 52-1, 52-2, 52-3, and 52-4 may be mounted on the seats 72-1, 72-2, 72-3, and 72-4 again. In addition, when the heater members 51-1, 51-2, 51-3, and 51-4 are further lowered from the contact position, the heater members 51-1, 51-2, 51-3, and 51-4 may be separated from the support plates 52-1, 52-2, 52-3, and 52-4, and may be returned to the load position as illustrated in FIG. 6.

At the load position, the substrates positioned on the lift pins 53-1, 53-2, 53-3, and 53-4 may be unloaded through substrate entrances 70-1, 70-2, 70-3, and 70-4 formed in the chamber 10.

As described above, in the thin film deposition apparatus according to the embodiments, an elevating/lowering timing of the lift pin is automatically performed without separate control according to each position, and the heater members 51-1, 51-2, 51-3, and 51-4 and the support plates 52-1, 52-2, 52-3, and 52-4 may rotate together without interfering with other structures at the process position.

However, since the heater members 51-1, 51-2, 51-3, and 51-4 and the support plates 52-1, 52-2, 52-3, and 52-4 are in contact with each other only by the fingers 75-1, 75-2, 75-3, and 75-4 during the rotation, there is a possibility that the support plates 52-1, 52-2, 52-3, and 52-4 fluctuate or slip relative to the heater members 51-1, 51-2, 51-3, and 51-4.

In order to prevent such fluctuation or slip, coupling grooves capable of being coupled with the fingers 75-1, 75-2, 75-3, and 75-4 may be formed on the lower surfaces of the support plates 52-1, 52-2, 52-3, and 52-4. FIG. 10 is a perspective view of a support plate 52 according to an example embodiment viewed from below, and FIG. 11 is a perspective view of a state in which a finger 75 is coupled to a coupling groove 73 formed in the support plate 52 viewed from below.

As illustrated, recesses 62 that are concave in an inner radial direction within a predetermined circumferential angle may be formed in the support plate 52 to prevent interference in connecting the four support columns 55a, 55b, 55c and 55d between the heater members 51-1, 51-2, 51-3, and 51-4.

In addition, a coupling groove 73 capable of being engaged with the finger 75 may be formed on the lower surface of the support plate 52, such that fluctuation or slip between the heater member 51 and the support plate 52 may be prevented even if the heater member 51 is elevated or rotated. However, a clearance such that the finger 75 may be separated from the coupling groove 73 of the support plate 52 without interference when the heater member 51 is lowered is required between the finger 75 and the coupling groove 73.

Meanwhile, when the support plates 52-1, 52-2, 52-3, and 52-4 are seated on the seats 72-1, 72-2, 72-3, and 72-4, or when the support plates 52-1, 52-2, 52-3, and 52-4 are returned to the seats 72-1, 72-2, 72-3, and 72-4, additional consideration may be needed to ensure that the support plates 52-1, 52-2, 52-3, and 52-4 are stably seated on the seats 72-1, 72-2, 72-3, and 72-4.

FIG. 12 is a view illustrating an example in which a plurality of steps 74-1, 74-2, 74-3, and 74-4 are additionally formed in the seats 72-1, 72-2, 72-3, and 72-4 by modifying FIG. 9. In FIG. 12, the steps 74-1, 74-2, 74-3, and 74-4 are formed in the seats 72-1, 72-2, 72-3, and 72-4 so that the support plates 52-1, 52-2, 52-3, and 52-4 may be placed at right positions on the seats 72-1, 72-2, 72-3, and 72-4 when the support plates 52-1, 52-2, 52-3, and 52-4 are lowered together with the heater members 51-1, 51-2, 51-3, and 51-4. The steps 74-1, 74-2, 74-3, and 74-4 may ensure that the support plates 52-1, 52-2, 52-3, and 52-4 are always positioned at the right positions on the seats 72-1, 72-2, 72-3, and 72-4 even in a situation where some fluctuation or gap occurs during the process of moving the position described above.

Many modifications and other embodiments of the disclosure will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

What is claimed is:

1. A thin film deposition apparatus comprising:
a chamber configured to process a plurality of substrates;
a plurality of heater members disposed to correspond to the substrates to heat the substrates;
a plurality of lift pins configured to be elevated through the heater members and support lower surfaces of the substrates;
a plurality of support plates on which lower ends of the lift pins are configured to be seated;
a plurality of support columns coupled with and supporting the heater members;
a plurality of spray ports configured to supply a process gas to the substrates; and
a plurality of fingers protruding from the support columns in a lateral direction and configured to lift lower surfaces of the support plates,
wherein the support plates are mounted on a plurality of seats formed on at least one side of the chamber, and configured to be elevated off of the seats and together with the heater members when the heater members are elevated.

2. The thin film deposition apparatus of claim 1, wherein the seats protrude from a sidewall of the chamber toward an inside of the chamber.

3. The thin film deposition apparatus of claim 2, wherein the seats uniformly protrude from the sidewall of the chamber toward the inside of the chamber along a circumferential direction.

4. A thin film deposition apparatus comprising:
a chamber configured to process a plurality of substrates;
a plurality of heater members disposed to correspond to the substrates to heat the substrates;
a plurality of lift pins configured to be elevated through the heater members and support lower surfaces of the substrates;
a plurality of support plates on which lower ends of the lift pins are configured to be seated;
a plurality of support columns coupled with and supporting the heater members; and
a plurality of spray ports configured to supply a process gas to the substrates,
wherein the support plates are mounted on a plurality of seats formed on at least one side of the chamber, and configured to be elevated together with the heater members when the heater members are elevated,
wherein a plurality of fingers protruding in a lateral direction are formed on the support columns, and when the support columns are elevated together with the heater members, the fingers are configured to lift lower surfaces of the support plates, wherein the seats protrude from a sidewall of the chamber toward an inside of the chamber,
wherein the seats are formed with a plurality of steps, and
wherein the support plates are configured to be placed at right positions on the seats when the support plates are lowered together with the heater members.

5. A thin film deposition apparatus comprising:
a chamber configured to process a plurality of substrates;
a plurality of heater members disposed to correspond to the substrates to heat the substrates;
a plurality of lift pins configured to be elevated through the heater members and support lower surfaces of the substrates;
a plurality of support plates on which lower ends of the lift pins are configured to be seated;
a plurality of support columns coupled with and supporting the heater members; and
a plurality of spray ports configured to supply a process gas to the substrates,
wherein the support plates are mounted on a plurality of seats formed on at least one side of the chamber, and configured to be elevated together with the heater members when the heater members are elevated,
wherein a plurality of fingers protruding in a lateral direction are formed on the support columns, and when the support columns are elevated together with the heater members, the fingers are configured to lift lower surfaces of the support plates, and
wherein at a load position where the lift pins are maximally exposed to upper sides of the heater members so that the substrates are loaded or unloaded, the support plates are configured to maintain a state mounted on the seats even if the heater members are elevated.

6. The thin film deposition apparatus of claim 5, wherein at a contact position where the heater members are elevated together with the support columns and are moved by a specific distance, the fingers are configured to start to be in contact with the lower surfaces of the support plates.

7. The thin film deposition apparatus of claim 6, wherein when the heater members are moved by the specific distance, exposure values of the lift pins to the heater members are configured to reach 0.

8. The thin film deposition apparatus of claim 6, wherein at a process position where the heater members are closest to the spray ports and the spray ports supply the process gas to the substrates, the lower ends of the lift pins and the support plates are configured to be spaced apart from each other, and the support plates and the seats are configured to be farthest apart from each other.

9. The thin film deposition apparatus of claim 1, further comprising a driver configured to elevate, lower or rotate the heater members,
wherein a coupling groove configured to be engaged with a portion of one of the fingers is formed on a lower surface of each of the support plates.

* * * * *